(12) United States Patent
Cheng et al.

(10) Patent No.: US 11,407,636 B2
(45) Date of Patent: Aug. 9, 2022

(54) INTER-POLY CONNECTION FOR PARASITIC CAPACITOR AND DIE SIZE IMPROVEMENT

(71) Applicant: Taiwan Semiconductor Manufacturing Co., Ltd., Hsin-Chu (TW)

(72) Inventors: Shyh-Wei Cheng, Zhudong Township (TW); Chih-Yu Wang, Taichung (TW); Hsi-Cheng Hsu, Taichung (TW); Ji-Hong Chiang, Changhua (TW); Jui-Chun Weng, Taipei (TW); Shiuan-Jeng Lin, Hsinchu (TW); Wei-Ding Wu, Zhubei (TW); Ching-Hsiang Hu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 190 days.

(21) Appl. No.: 16/122,180

(22) Filed: Sep. 5, 2018

(65) Prior Publication Data

US 2018/0370790 A1 Dec. 27, 2018

Related U.S. Application Data

(62) Division of application No. 14/980,297, filed on Dec. 28, 2015, now Pat. No. 10,155,656.

(Continued)

(51) Int. Cl.
*B81B 7/00* (2006.01)
*B81C 1/00* (2006.01)

(52) U.S. Cl.
CPC ............ *B81B 7/007* (2013.01); *B81B 7/0006* (2013.01); *B81C 1/00238* (2013.01);
(Continued)

(58) Field of Classification Search
CPC .............. B81B 7/007; B81B 2207/012; B81B 2207/096; B81C 1/00301; B81C 1/00269;
(Continued)

(56) References Cited

U.S. PATENT DOCUMENTS 8,564,076 B1 * 10/2013 Huang ................ B81C 1/00269
257/414
9,550,668 B1 * 1/2017 Xia ......................... H01L 29/84
(Continued)

FOREIGN PATENT DOCUMENTS

CN 102583220 A 7/2012
CN 102751172 A 10/2012
CN 104733371 A 6/2015

OTHER PUBLICATIONS

Fischer, et al. "Integrating MEMS and ICs." Microsystems and Nanoengineering 1, article No. 15005 (2015. Published May 28, 2015.
(Continued)

*Primary Examiner* — Brigitte A Paterson
(74) *Attorney, Agent, or Firm* — Eschweiler & Potashnik, LLC

(57) ABSTRACT

The present disclosure, in some embodiments, relates to a method of forming a micro-electromechanical system (MEMS) package. The method includes forming one or more depressions within a capping substrate. A back-side of a MEMS substrate is bonded to the capping substrate after forming the one or more depressions, so that the one or more depressions define one or more cavities between the capping substrate and the MEMS substrate. A front-side of the MEMS substrate is selectively etched to form one or more trenches extending through the MEMS substrate, and one or more polysilicon vias are formed within the one or more trenches. A conductive bonding structure is formed on the front-side of the MEMS substrate at a location contacting
(Continued)

the one or more polysilicon vias. The MEMS substrate is bonded to a CMOS substrate having one or more semiconductor devices by way of the conductive bonding structure.

20 Claims, 8 Drawing Sheets

Related U.S. Application Data

(60) Provisional application No. 62/243,376, filed on Oct. 19, 2015.

(52) U.S. Cl.
CPC .... *B81C 1/00301* (2013.01); *B81B 2207/012* (2013.01); *B81B 2207/096* (2013.01); *B81C 2201/013* (2013.01); *B81C 2203/0109* (2013.01); *B81C 2203/0118* (2013.01); *B81C 2203/037* (2013.01); *B81C 2203/0792* (2013.01)

(58) Field of Classification Search
CPC ........ B81C 2201/013; B81C 2201/019; B81C 2203/0109; B81C 2203/037; B81C 2203/0792
See application file for complete search history.

(56) References Cited

U.S. PATENT DOCUMENTS

| | | |
|---|---|---|
| 2002/0166838 A1 | 11/2002 | Nagarajan |
| 2007/0035001 A1 | 2/2007 | Kuhmann et al. |
| 2008/0164542 A1 | 7/2008 | Yang et al. |
| 2008/0169515 A1 | 7/2008 | Hwang |
| 2009/0134459 A1 | 5/2009 | Goto et al. |
| 2010/0284553 A1 | 11/2010 | Conti et al. |
| 2012/0049299 A1 | 3/2012 | Chou |
| 2012/0142144 A1* | 6/2012 | Taheri ...................... B81B 7/007 438/107 |
| 2013/0168852 A1* | 7/2013 | Liang ...................... B81B 7/0077 257/737 |
| 2013/0277771 A1 | 10/2013 | Chou et al. |
| 2014/0248731 A1 | 9/2014 | Huang et al. |
| 2014/0264909 A1* | 9/2014 | Liu ...................... B81C 1/00301 257/774 |
| 2015/0158716 A1 | 6/2015 | Cheng et al. |
| 2016/0119722 A1 | 4/2016 | Chu et al. |
| 2016/0318757 A1* | 11/2016 | Chou .................. B81C 1/00357 |
| 2017/0036908 A1* | 2/2017 | Xu .................. H01L 21/823437 |
| 2019/0035905 A1* | 1/2019 | Kim .................. G01C 19/5719 |

OTHER PUBLICATIONS

Non-Final Office Action dated Nov. 16, 2016 for U.S. Appl. No. 14/980,297.
Final Office Action dated May 5, 2017 for U.S. Appl. No. 14/980,297.
Non-Final Office Action dated Nov. 27, 2017 for U.S. Appl. No. 14/980,297.
Final Office Action dated Jun. 8, 2018 for U.S. Appl. No. 14/980,297.
Notice of Allowance dated Oct. 11, 2018 in connection with U.S. Appl. No. 14/980,297.

* cited by examiner

INTER-POLY CONNECTION FOR PARASITIC CAPACITOR AND DIE SIZE IMPROVEMENT

REFERENCE TO RELATED APPLICATIONS

This Application is a Divisional of U.S. application Ser. No. 14/980,297 filed on Dec. 28, 2015, which claims priority to U.S. Provisional Application No. 62/243,376 filed on Oct. 19, 2015. The contents of the above-referenced Applications are hereby incorporated by reference in their entirety.

BACKGROUND

In the past decade, micro-electromechanical system (MEMS) devices have become increasingly common in electronic devices (e.g., cell phones, sensors, etc.). MEMS devices include mechanical and electrical features that are able to that sense physical forces or quantities (e.g., acceleration, radiation, etc.) and/or control physical quantities (e.g., fluids). Examples of MEMS devices include microsensors, which convert mechanical signals into electrical signals, and micro-actuators, which convert electrical signals into mechanical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
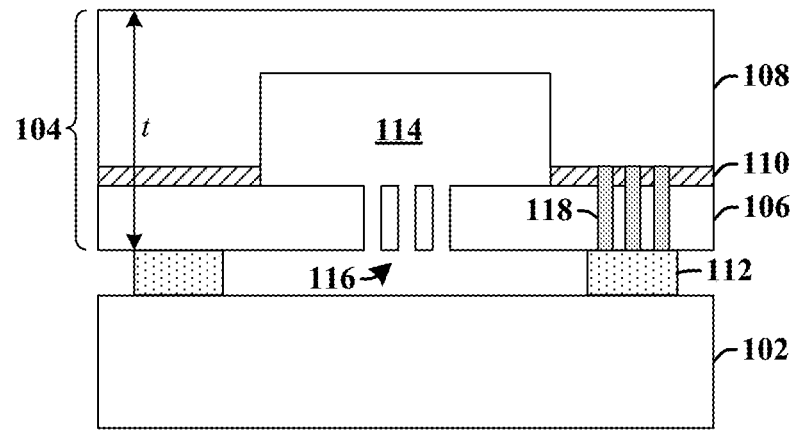
FIG. 1 illustrates some embodiments of a cross-sectional view of a micro-electromechanical system (MEMS) package having an inter-tier polysilicon connection.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, the semiconductor industry has begun to fabricate MEMS devices using semiconductor device fabrication methods. This has enabled MEMS devices to be electrically connected to integrated circuits (ICs) to form complete MEMS systems. The MEMS devices are configured to sense or control physical, optical, or chemical quantities, while the ICs provide signal processing functionalities for electrical signals output from the MEMS devices (e.g., analog-to-digital conversion, amplification, filtering, information processing, etc.).

Typically, MEMS devices and ICs may be formed in system-in-packages (SIPs), which stack an IC and one or more MEMS devices onto one another and make connections therebetween using wire bond connections. However, it has been appreciated that such SIP configurations have a number of drawbacks. For example, the wire bond connections cause SIPs to have a relatively large form factor (i.e., size) that decreases device density and increases cost. Furthermore, the wire bond connections used in SIPs contribute a parasitic capacitance to signals output from a MEMS device. The parasitic capacitance reduces signal quality of MEMS devices using capacitive sensing, and thereby may degrade performance of the MEMS devices.

The present disclosure relates to micro-electromechanical system (MEMS) package that uses polysilicon inter-tier connections to provide for a low parasitic capacitance between a MEM device and an integrated circuit, and a method of formation. In some embodiments, the MEMS package comprises a CMOS substrate having one or more semiconductor devices arranged within a semiconductor body. A MEMS substrate having an ambulatory element is connected to the CMOS substrate by a conductive bonding structure. The conductive bonding structure is arranged on a front-side of the MEMS substrate at a location that is laterally offset from the ambulatory element. One or more polysilicon vias extend through the conductive MEMS substrate to the bonding structure. The one or more polysilicon vias are configured to electrically couple the MEMS substrate to the CMOS substrate. By connecting the MEMS substrate to the CMOS substrate using the polysilicon vias, the parasitic capacitance and form factor of the MEMS package are reduced.

FIG. 1 illustrates some embodiments of a cross-sectional view of a MEMS package 100 having an inter-tier polysilicon connection.

The MEMS (micro-electromechanical system) package 100 comprises a CMOS substrate 102 and a MEMS structure 104. The CMOS substrate 102 comprises an integrated chip having a plurality of semiconductor devices (e.g., transistors, capacitors, resistors, inductors, and diodes) configured to support operation of the MEMS structure 104. The MEMS structure 104 comprises one or more MEMS devices (e.g., a motion sensor, a pressure sensor, a microphone, a gyroscope, etc.).

The MEMS structure 104 comprises a MEMS substrate 106 and a capping substrate 108. The capping substrate 108 has a depression within a surface facing the MEMS substrate 106. The capping substrate 108 is bonded to the MEMS substrate 106 by way of an adhesive layer 110 to form a cavity 114 arranged between the MEMS substrate 106 and the capping substrate 108. The MEMS substrate 106 comprises an ambulatory element 116 (e.g., a proof mass, a flexible membrane, etc.) arranged within the cavity 114. The ambulatory element 116 is configured to move within the cavity 114 in response to an external stimuli (e.g., a motion of the MEMS package 100, a sound wave, a change in pressure, etc.) and to generate an electrical output signal that correlates to the external stimuli. In some embodiments, the adhesive layer 110 may comprise a dielectric layer (e.g., an oxide layer) that facilitates a fusion bond between the MEMS substrate 106 and the capping substrate 108.

The MEMS structure 104 is electrically coupled to the CMOS substrate 102 by way of one or more electrically conductive inter-tier polysilicon connections 118. The inter-tier polysilicon connections 118 extend through the MEMS substrate 106 to a conductive bonding structure 112 arranged on the CMOS substrate 102. In some embodiments, the inter-tier polysilicon connections 118 may further extend through the adhesive layer 110 to contact the capping substrate 108. The inter-tier polysilicon connections 118 comprise a doped polysilicon material that is electrically conductive, thereby forming an electrical connection between the MEMS structure 104 and the CMOS substrate 102.

The inter-tier polysilicon connections 118 provide for a short connection distance between the MEMS structure 104 and the CMOS substrate 102. The short connection distance results in a relatively small parasitic capacitance that improves performance (e.g., by reducing noise of a signal received from the MEMS structure 104). Furthermore, polysilicon has a similar crystalline structure to the MEMS substrate 106, which causes the inter-tier polysilicon connections 118 to induce a relatively small stress on the MEMS substrate 106 (e.g., in comparison to inter-tier metal connections, which stress the MEMS substrate and thereby induce warpage and/or damage to the MEMS substrate). This allows for the MEMS substrate 106 to have a small thickness t that further improves a form factor and reduces a parasitic capacitance of the MEMS package 100 (e.g., in some embodiments, the MEMS structure 104 may have a thickness t that is less than or equal to approximately 10 mm).

Figure 2:
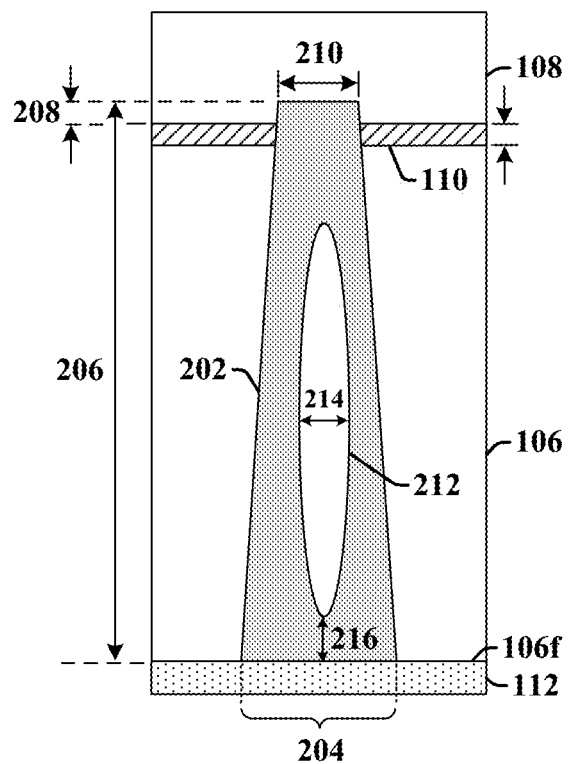
FIG. 2 illustrates some additional embodiments of a cross-sectional view of an inter-tier polysilicon connection arranged within a MEMS substrate.

FIG. 2 illustrates a cross-sectional view of some embodiments of a substrate 200 having a polysilicon inter-tier connection comprising a polysilicon via arranged within a MEMS substrate.

The substrate 200 comprises a polysilicon via 202 arranged within a trench 204 extending through a MEMS substrate 106. In some embodiments, the polysilicon via 202 may vertically extend from a capping substrate 108 to a conductive bonding structure 112 electrically coupled to a CMOS substrate (not shown). In some embodiments, the trench 204 may have a height 206 that is in a range of between approximately 20 microns (um) and approximately 40 um. In some embodiments, the polysilicon via 202 may extend to within a recess within the capping substrate 108. For example, the polysilicon via 202 may extend within the capping substrate 108 to a distance 208 that is in a range of between approximately 1 um and approximately 5 um.

The polysilicon via 202 has tapered sidewalls. In some embodiments, the tapered sidewalls may directly contact the MEMS substrate 106. As stated above, because of the crystalline structure of the polysilicon via 202, the polysilicon via 202 is able to directly contact the MEMS substrate 106 without substantially stressing the MEMS substrate 106. The tapered sidewalls cause a width 210 of the polysilicon via 202 to decrease as a distance from the conductive bonding structure 112 increases. For example, the polysilicon via 202 has a smaller width at a location that abuts adhesive layer 110 than at a location within the MEMS substrate 106.

In some embodiments, the polysilicon via 202 may comprise a polysilicon material surrounding a void 212 (e.g., an air-gap). The void 212 may have a width 214 that is between one-third and one-half of a width 210 of the trench 204. For example, the width 214 of the void 212 may be in a range of between approximately 0.5 um and approximately 2 um and the trench 204 may have a width in a range of between approximately 1 um and approximately 5 um. In some embodiments, the void 212 is vertically offset from lateral surfaces of the MEMS substrate 106. For example, the void 212 may be located a distance 216 that is in a range of between approximately 1 um and approximately 5 um below surface 106f of the MEMS substrate 106. In other embodiments, the void 212 may extend to a position that contacts the conductive bonding structure 112.

Figure 3:
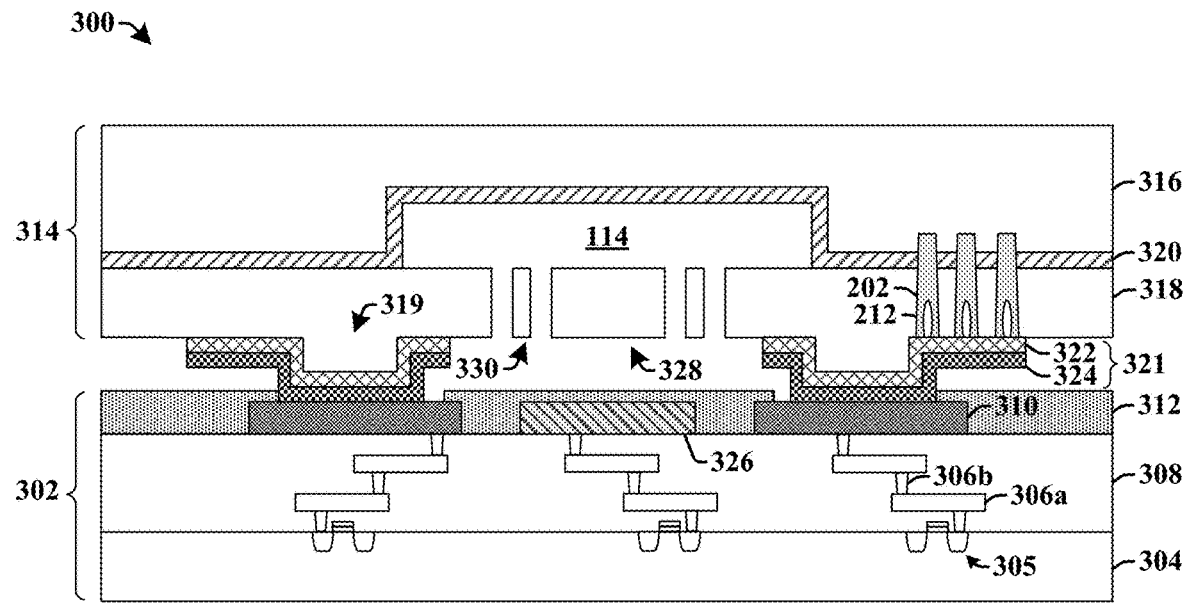
FIG. 3 illustrates some additional embodiments of a cross-sectional view of a MEMS package having an inter-tier polysilicon connection.

FIG. 3 illustrates some embodiments of a cross-sectional view of a MEMS package 300 having an inter-tier polysilicon connection.

The MEMS package 300 comprises a CMOS substrate 302 and a MEMS structure 314. The CMOS substrate 302 comprises a semiconductor body 304 and an overlying BEOL metallization stack. A plurality of transistor devices 305 (e.g., CMOS transistors) are arranged within the semiconductor body 304. The plurality of transistor devices 305 are configured to provide such functions as analog-to-digital conversion, amplification, storage, filtering, etc. The BEOL metallization stack comprises a plurality of metal interconnect layers, 306a and 306b, arranged within a dielectric structure 308 having a plurality of inter-level dielectric (ILD) layers. In some embodiments, the plurality of metal interconnect layers comprise alternating layers of metal interconnect wires 306a and metal vias 306b. In various embodiments, the plurality of ILD layers may comprise a low-k dielectric layer (e.g., SiCO), an ultra low-k dielectric layer, and/or an oxide, for example. In various embodiments, the plurality of metal interconnect layers may comprise copper, aluminum, or tungsten, for example.

The plurality of metal interconnect layers, 306a and 306b, connect one or more of the plurality of transistor devices 307 to one or more conductive bond pads 310 located along an upper surface of the CMOS substrate 302. The conductive bond pads 310 may comprise aluminum, for example. In some embodiments, the plurality of metal interconnect layers, 306a and 306b, may also connect one or more of the plurality of transistor devices 307 to one or more capacitive sensing electrodes 326 arranged on the CMOS substrate 302. In some embodiments, a dielectric material 312 is laterally arranged between the conductive bond pads 310 and/or the one or more capacitive sensing electrodes 326.

The MEMS structure 314 comprises a MEMS substrate 318 and a capping substrate 316. In some embodiments, the MEMS substrate 318 comprises a conductive material. For example, in some embodiments, the MEMS substrate 318 may comprise a silicon substrate doped to have a p-type doping or an n-type doping. In other embodiments, the MEMS substrate 318 may comprise polysilicon. The capping substrate 316 comprises a silicon substrate. The MEMS substrate 318 is coupled to the capping substrate 316 by way of a dielectric layer 320 (e.g., an oxide).

The capping substrate 316 comprises a cavity 114 arranged within a side of the capping substrate 316 facing the MEMS substrate 318. The MEMS substrate 318 comprises an ambulatory element 116 in communication with the cavity 114. In some embodiments, the ambulatory element 328 may be connected to one or more springs 330, which allow the ambulatory element 328 to move in response to motion of the MEMS package 300. In some embodiments, the dielectric layer 320 lines inner surfaces of the cavity 114. In some embodiments, the capping substrate 316 further includes anti-stiction bumps (not shown) arranged within the cavity 114 and configured to reduce stiction between the capping substrate 316 and the ambulatory element 116.

The ambulatory element 328 is configured to move in response to an external stimuli (e.g., a motion of the MEMS package 300, a sound wave, a change in pressure, etc.). The movement of the ambulatory element 328 causes a capacitance relating to the ambulatory element 328 to change in a manner that correlates to the external stimuli. For example, in some embodiments, movement of the ambulatory element 328 may change a capacitance measured between the ambulatory element 328 and the capacitive sensing electrodes 326. In other embodiments, movement of the ambulatory element 328 may change a capacitance measured between different parts of the MEMS substrate 318.

Polysilicon vias 202 extend through the MEMS substrate 318 from the capping substrate 316 to a conductive bonding structure 321 arranged between the MEMS substrate 318 and the conductive bond pads 310. The polysilicon vias 202 are configured to electrically couple the MEMS structure 314 to the underlying CMOS substrate 302. In some embodiments, the polysilicon vias 202 may comprise multiple polysilicon vias 202 arranged in parallel between the MEMS substrate 318 and the conductive bonding structure 321. In some embodiments, the polysilicon vias 202 may comprise a void 212 arranged along an upper surface of the polysilicon vias 202. In such embodiments, the conductive bonding structure 321 may extend into the void 212.

In some embodiments, the conductive bonding structure 321 may comprise a conductive routing layer 322 and a eutectic bonding layer 324. In some embodiments, the conductive routing layer 322 may comprise doped polysilicon. The eutectic bonding layer 324 is arranged between the conductive routing layer 322 and the conductive bond pads 310. In some embodiments, the eutectic bonding layer 324 may comprise aluminum or germanium. In some embodiments, sidewalls of the conductive routing layer 322 may be aligned with sidewalls of the eutectic bonding layer 324.

In some embodiments, the conductive routing layer 322 laterally extends from a location contacting the one or more polysilicon vias 202 to a location overlying one or more protrusions 319 that extend vertically outward from a backside of the MEMS substrate 318. In some embodiments, the polysilicon vias 202 may be arranged along a same side of a protrusion 319. In some embodiments, the polysilicon vias 202 may be arranged adjacent to a subset (i.e., not all) of the protrusions 319.

Figure 4:
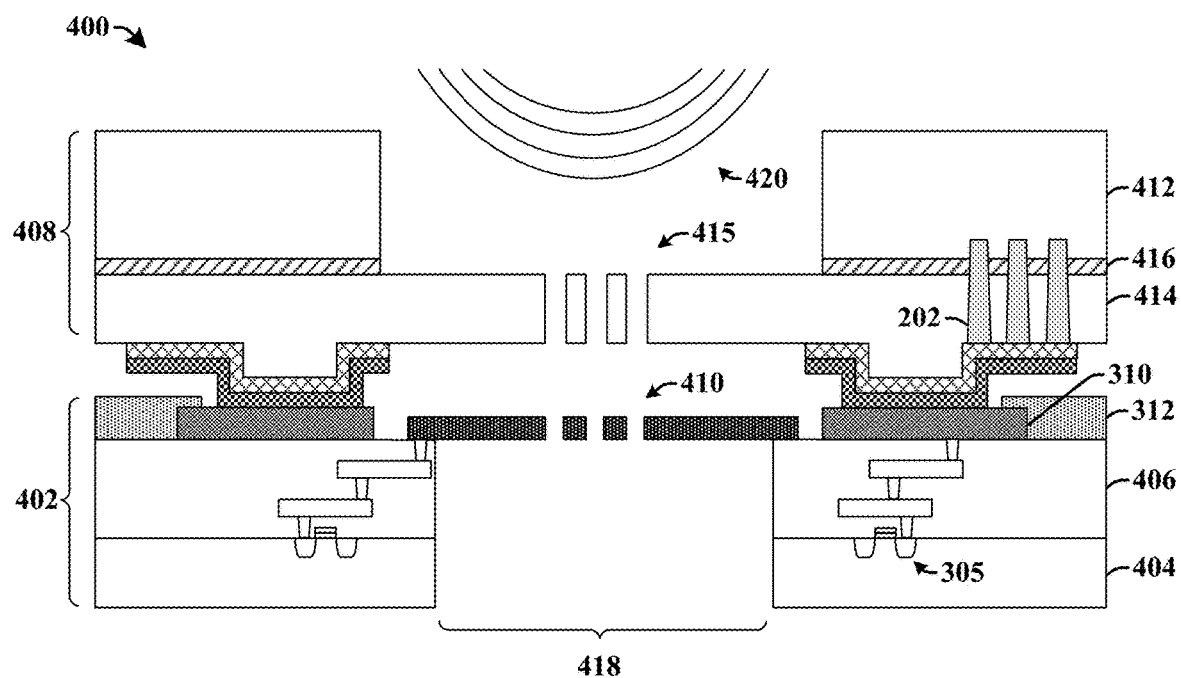
FIG. 4 illustrates some embodiments of a MEMS microphone comprising an inter-tier polysilicon connection.
Figure 5:
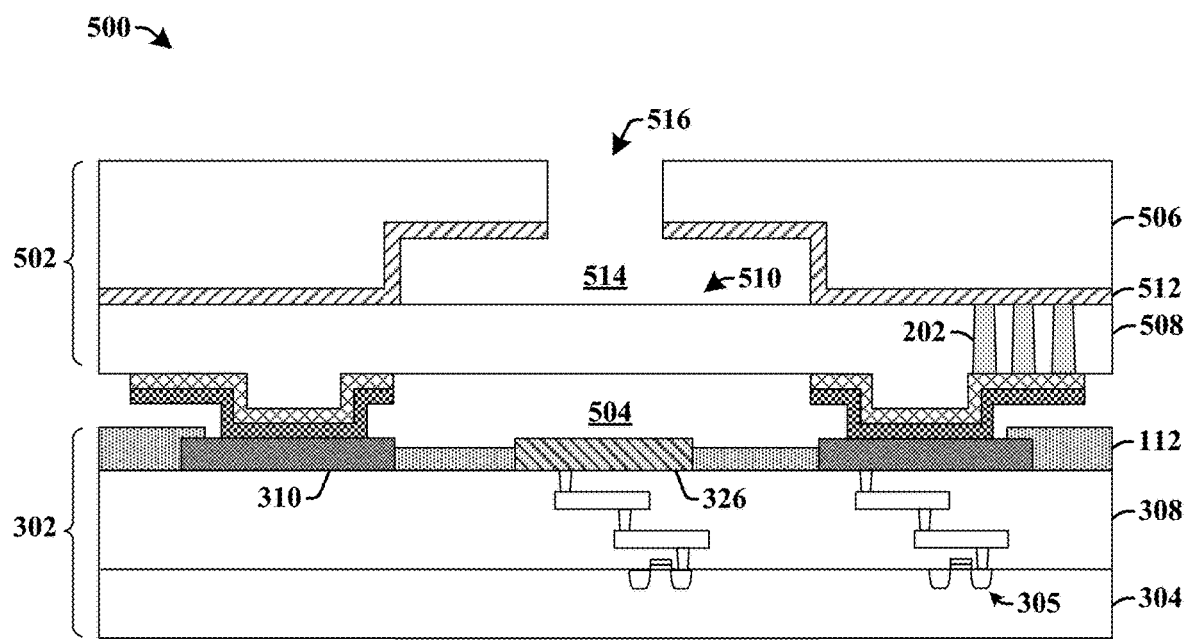
FIG. 5 illustrates some embodiments of a MEMS pressure sensor comprising an inter-tier polysilicon connection.

FIGS. 4-5 illustrate some more detailed examples of MEMS devices having inter-tier polysilicon connections. Although FIGS. 4-5 illustrates specific types of MEMS devices, it will be appreciated that the inter-tier polysilicon connections are not limited to such devices, but rather may be used with any type of MEMS device (e.g., a gyroscope, a motion sensor, etc.).

FIG. 4 illustrates some embodiments of a MEMS microphone 400 comprising inter-tier polysilicon connections.

The MEMS microphone 400 comprises a cavity 418 extending through a CMOS substrate 402 (e.g., through semiconductor body 404 and dielectric layer 406) and a MEMS structure 408 (e.g., through capping substrate 412 and dielectric layer 416). The MEMS structure 408 comprises a MEMS substrate 414 having a conductive diaphragm 415 arranged in the cavity 418 at a position above a conductive back-plate 410 (e.g., a polysilicon back-plate arranged on the CMOS substrate 402). The MEMS structure 408 and the CMOS substrate 402 are electrically connected by polysilicon vias 202 vertically extending through the MEMS substrate 414. The polysilicon vias 202 form an electrical connection between the conductive diaphragm 415 and the CMOS substrate 402.

During microphone operation, sound in the form of a time-varying pressure wave 420 strikes the conductive diaphragm 415, thereby causing small displacements in the conductive diaphragm 415 relative to the conductive back-plate 410. The magnitude and frequency of the displacements correspond to a volume and pitch of the time-varying pressure wave 420. To convert these displacements into an electrical signal, devices within the CMOS substrate 402 measure the time-varying capacitance between the conductive diaphragm 415 and the conductive back-plate 410.

FIG. 5 illustrates some embodiments of a MEMS pressure sensor 500 comprising inter-tier polysilicon connections.

The MEMS pressure sensor 500 comprises a MEMS structure 502 arranged over a CMOS substrate 302. The MEMS structure 502 comprises a MEMS substrate 508 that is bonded to a capping substrate 506 by way of a dielectric layer 512. The MEMS substrate 508 comprises an ambulatory element 510 comprising a deflectable diaphragm extending over a hermetically sealed chamber 504 arranged between the CMOS substrate 302 and the MEMS substrate 508. A cavity 514 is arranged between the MEMS substrate 508 and the capping substrate 506. The cavity 514 is in communication with an ambient environment by way of an opening 516 extending through the capping substrate 506 and the dielectric layer 512.

The MEMS structure 502 and the CMOS substrate 302 are electrically connected by polysilicon vias 202 vertically extending through the MEMS substrate 508. The polysilicon vias 202 form an electrical connection between the ambulatory element 510 and the CMOS substrate 302. During operation of the MEMS pressure sensor 500, a pressure within the cavity 514 will cause the ambulatory element 510 to move depending on a relationship between the pressure and a reference pressure within the hermetically sealed chamber 504. As the ambulatory element 510 moves a capacitance between the ambulatory element 510 and a capacitive sensing electrode 326 changes, thereby indicating a change in a pressure of the ambient environment.

FIGS. 6-15 illustrate some embodiments of cross-sectional views 600-1500 showing a method of forming a micro-electromechanical system (MEMS) package having an inter-tier polysilicon connection.

Figure 6:
FIGS. 6-15 illustrate some embodiments of cross-sectional views showing a method of forming a micro-electromechanical system (MEMS) package having an inter-tier polysilicon connection.

As shown in cross-sectional view 600 of FIG. 6, a capping substrate 602 is provided. In various embodiments, the capping substrate 602 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

Figure 7:
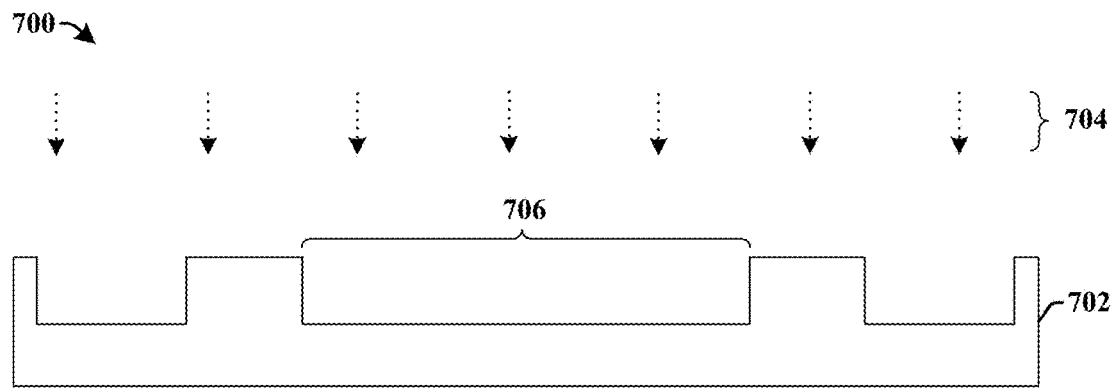

As shown in cross-sectional view 700 of FIG. 7, the capping substrate 702 is selectively exposed to a first etchant 704 configured to form one or more depressions 706 within the capping substrate 702. In some embodiments, the capping substrate 702 may be etched according to a first masking layer (not shown). In various embodiments, the first masking layer may comprise photoresist or a nitride (e.g., SiN) patterned using a photolithography process. In various embodiments, the first etchant 704 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)).

Figure 8:
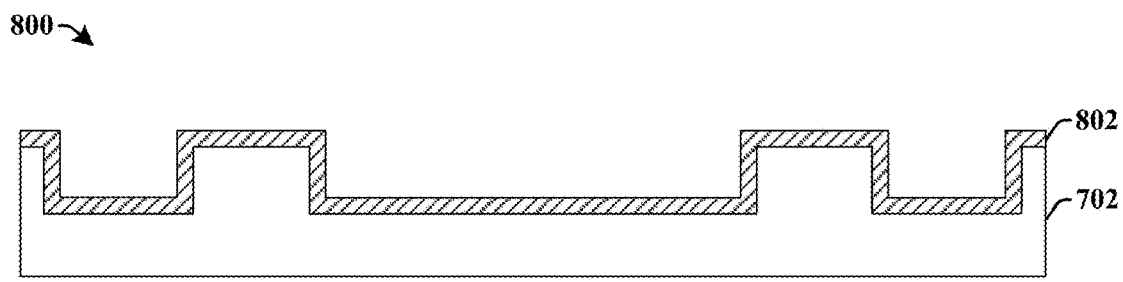

As shown in cross-sectional view 800 of FIG. 8, a dielectric layer 802 (e.g., $SiO_2$) is formed over the capping substrate 702. In some embodiments, the dielectric layer 802 comprises an oxide (e.g., $SiO_2$) formed by way of a thermal process. In other embodiments, the dielectric layer 802 comprises an oxide (e.g., $SiO_2$) formed by way of a deposition process (e.g., chemical vapor deposition (CVD), physical vapor deposition (PVD), atomic layer deposition (ALD), etc.).

Figure 9:
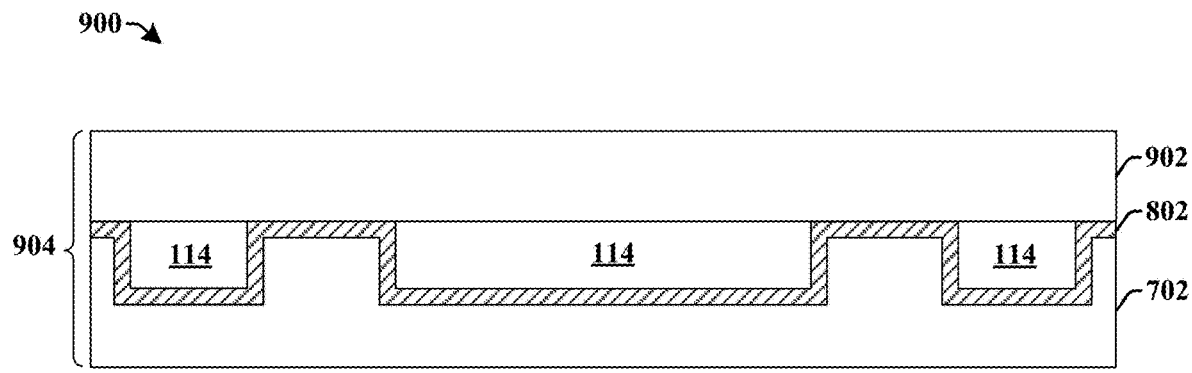

As shown in cross-sectional view 900 of FIG. 9, a MEMS substrate 902 is bonded to the dielectric layer 802 to form a MEMS structure 904. In some embodiments, the bonding process may comprise a fusion bonding process. In some embodiments, the MEMS substrate 902 may comprise a silicon substrate having a doping concentration that makes the MEMS substrate 902 conductive (e.g., having a p-type doping concentration). In other embodiments, the MEMS substrate 902 may comprise polysilicon. Bonding the MEMS substrate 902 to the dielectric layer 802 forms one or more cavities 114 arranged between the capping substrate 702 and the MEMS substrate 902.

Figure 10:
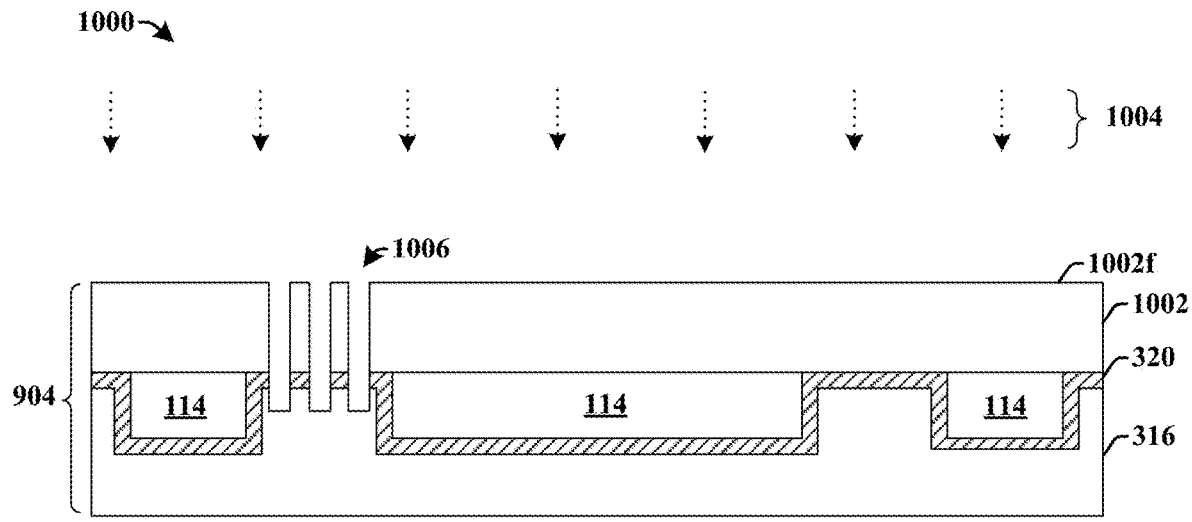

As shown in cross-sectional view 1000 of FIG. 10, the MEMS substrate 1002 is selectively exposed to a second etchant 1004 to form a plurality of trenches 1006 within the MEMS substrate 1002. The plurality of trenches 1006 may vertically extend from a front-side 1002f of the MEMS substrate 1002 to within the capping substrate 316. In some embodiments, the MEMS substrate 1002 may be etched according to a second masking layer (not shown). In various embodiments, the second masking layer may comprise photoresist or a nitride (e.g., SiN) patterned using a photolithography process. In various embodiments, the second etchant 1004 may comprise a dry etchant have an etching chemistry comprising a fluorine species (e.g., $CF_4$, $CHF_3$, $C_4F_8$, etc.) or a wet etchant (e.g., HF or TMAH).

Figure 11:
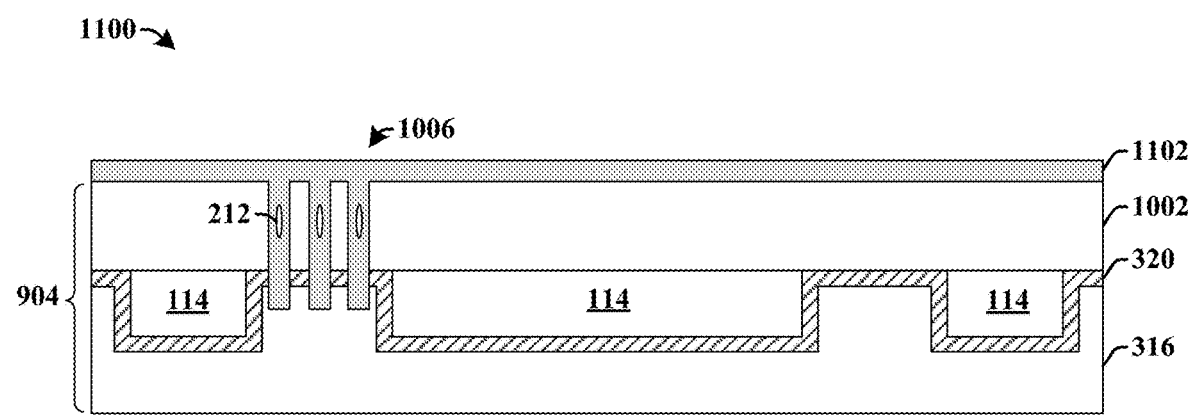

As shown in cross-sectional view 1100 of FIG. 11, the plurality of trenches 1006 are filled with a doped polysilicon material 1102. The doped polysilicon material 1102 may extend over a back-side of the MEMS substrate 1002. The doped polysilicon material 1102 may be formed by way of a deposition process (e.g., chemical vapor deposition (CVD), physical vapor deposition (PVD), atomic layer deposition (ALD), etc.). In some embodiments, the doped polysilicon is deposited within the plurality of trenches 1006 in a manner that forms void 212 within the doped polysilicon material 1102. In some embodiments, a planarization process may be performed after depositing the doped polysilicon material 1102 to form a plurality of polysilicon vias 202 by removing the doped polysilicon material 1102 disposed outside of the plurality of trenches 1006. In some embodiments, the planarization process may comprise a chemical mechanical polishing (CMP) process.

Figure 12:
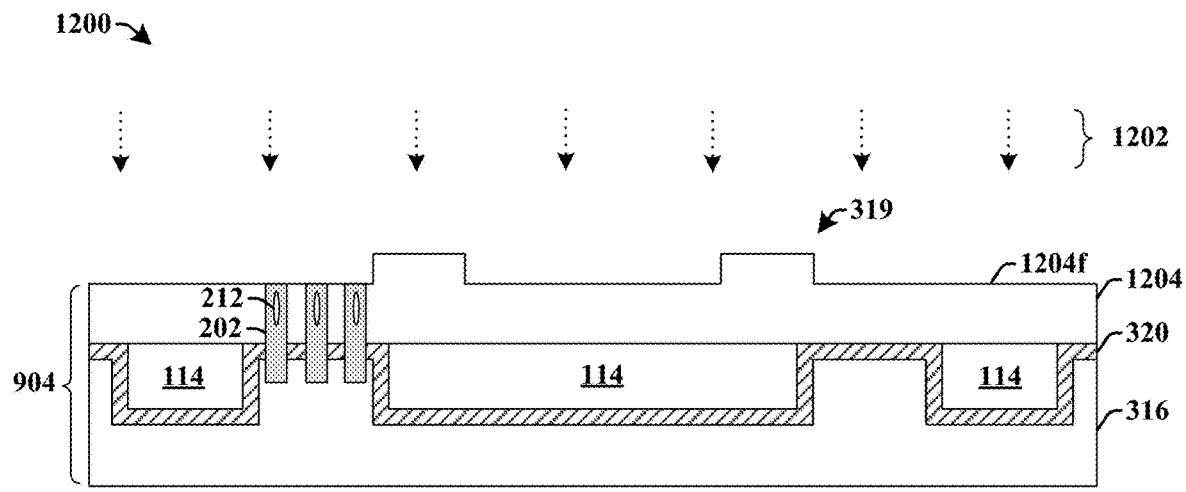

As shown in cross-sectional view 1200 of FIG. 12, a plurality of protrusions 319 are formed on a front-side 1204f of the MEMS substrate 1204. In some embodiments, the front-side 1204f of the MEMS substrate 1204 may be exposed to a third etchant 1202 according to a third masking layer (now shown). In some embodiments, the plurality of protrusions 319 are laterally offset from the plurality of polysilicon vias 202. In some embodiments, the etching process used to form the plurality of protrusions 319 removes polysilicon overlying the voids 212, so that the voids within the polysilicon vias 202 are exposed, thereby forming a recess within a surface of the one or more polysilicon vias 202.

Figure 13:
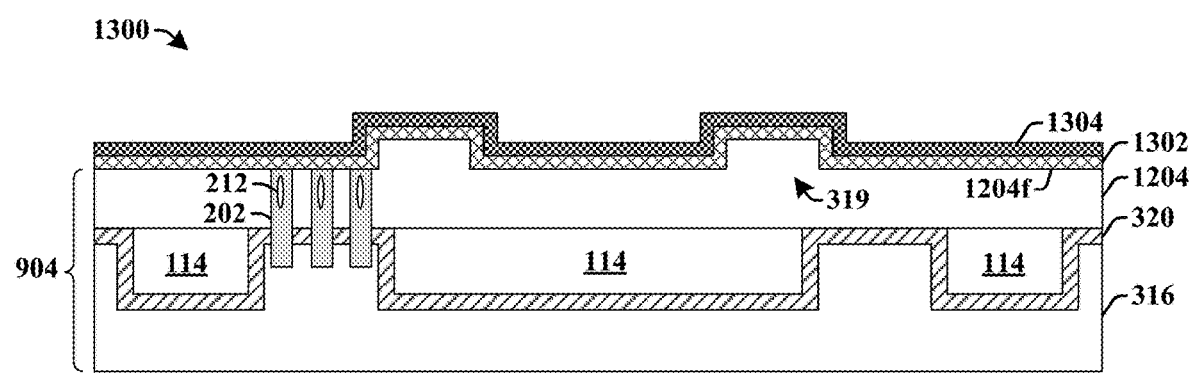

As shown in cross-sectional view 1300 of FIG. 13, a conductive routing layer 1302 is formed over the front-side 1204f of the MEMS substrate 1204. The conductive routing layer 1302 may comprise a doped polysilicon material that extends over the one or more polysilicon via 202 and the plurality of protrusions 319. The conductive routing layer 1302 may be formed by way of a deposition process (e.g., chemical vapor deposition (CVD), physical vapor deposition (PVD), atomic layer deposition (ALD), etc.).

A eutectic bonding layer 1304 is formed over the conductive routing layer 1302. In various embodiments, the eutectic bonding layer 1304 comprises a germanium layer or an aluminum layer arranged over the conductive routing layer 1302. In various embodiments, the eutectic bonding layer 1304 may be formed by way of a deposition process (e.g., chemical vapor deposition (CVD), physical vapor deposition (PVD), atomic layer deposition (ALD), etc.).

As shown in cross-sectional view 1400, the conductive routing layer 322 and the eutectic bonding layer 324 are patterned to form conductive bonding structures. The conductive bonding structures 321 extend from over the polysilicon vias 202 to over the plurality of protrusions 319. In some embodiments, the MEMS substrate 318 may also be etched to form openings that define an ambulatory element 328 and/or springs (not shown). In some embodiments, the conductive routing layer 322 and the eutectic bonding layer 324 may be patterned by exposing the MEMS substrate 318 to a fourth etchant 1402.

As shown in cross-sectional view 1500, the MEMS structure 314 is bonded to a CMOS substrate 302 having one or more transistor devices 307 arranged within a semiconductor body 304. In some embodiments, the MEMS structure 314 is bonded to the CMOS substrate 302 by way of a eutectic bonding process. The eutectic bonding process bonds the eutectic bonding layer 324 to conductive bond pads 310 arranged on the CMOS substrate 302. The conductive bond pads 310 are in electrical contact with the transistor device 307 arranged within the semiconductor body 304. In some embodiments, the conductive bond pads 310 may comprise aluminum.

Figure 15:
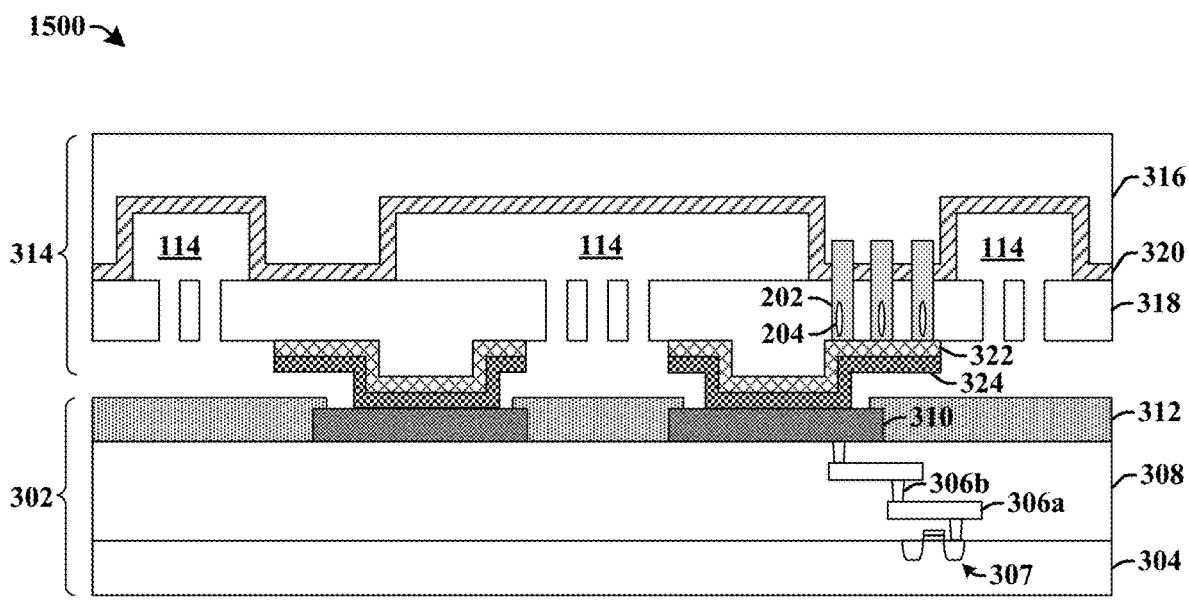
Figure 16:
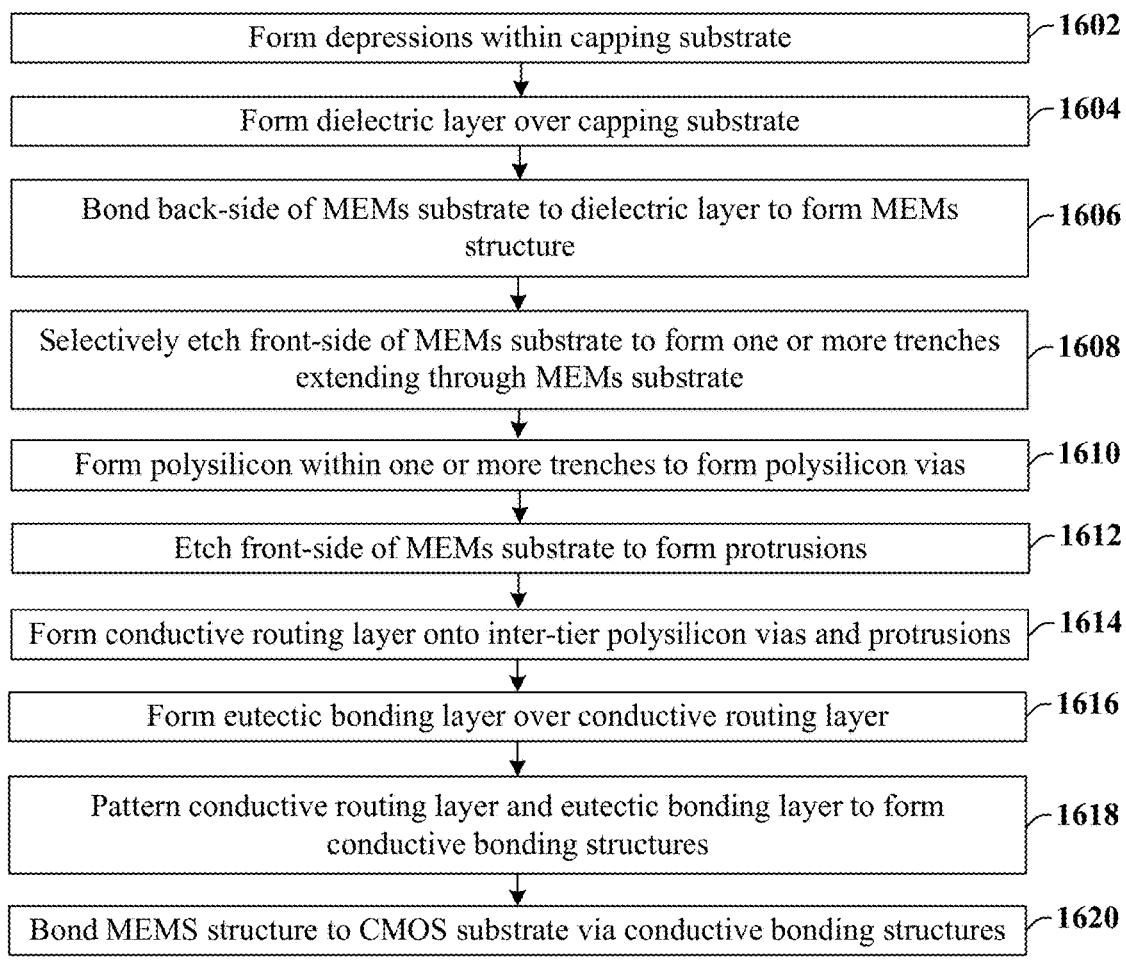
FIG. 16 illustrates a flow diagram of some embodiments of a method of forming a micro-electromechanical system (MEMS) package having an inter-tier polysilicon connection.

FIG. 16 illustrates some embodiments of a method of forming a micro-electromechanical system (MEMS) package having an inter-tier polysilicon connection. Although method 1600 is described in relation to FIGS. 6-15, it will be appreciated that the method 1600 is not limited to such structures, but instead may stand alone as a method independent of the structures.

While the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, one or more depressions are formed within the capping substrate. FIGS. 6-7 illustrate some embodiments of cross-sectional views 600-700 corresponding to act 1602.

At 1604, a dielectric layer is formed over the capping substrate. FIG. 8 illustrates some embodiments of a cross-sectional view 800 corresponding to act 1604.

At 1606, a back-side of a MEMS substrate is bonded to the dielectric layer to form a MEMS structure. FIG. 9 illustrates some embodiments of a cross-sectional view 900 corresponding to act 1606.

At 1608, a front-side of the MEMS substrate is selectively etched to form one or more trenches extending through the MEMS substrate. FIG. 10 illustrates some embodiments of a cross-sectional view 1000 corresponding to act 1608.

At 1610, polysilicon is formed within the one or more trenches to form polysilicon vias extending from the front side of the MEMS substrate to the capping substrate. In some embodiments, the polysilicon may be formed over the front-side of the MEMS substrate and a planarization process may be used remove polysilicon material outside of the trenches. FIG. 11 illustrates some embodiments of a cross-sectional view 1100 corresponding to act 1610.

At 1612, the front-side of the MEMS substrate is selectively etched to form a plurality of protrusions. FIG. 12 illustrates some embodiments of a cross-sectional view 1200 corresponding to act 1612.

At 1614, a conductive routing layer is formed onto the plurality of protrusions and the polysilicon vias. FIG. 13 illustrates some embodiments of a cross-sectional view 1300 corresponding to act 1614.

At 1616, a eutectic bonding layer is formed over the conductive routing layer. FIG. 13 illustrates some embodiments of a cross-sectional view 1300 corresponding to act 1616.

Figure 14:
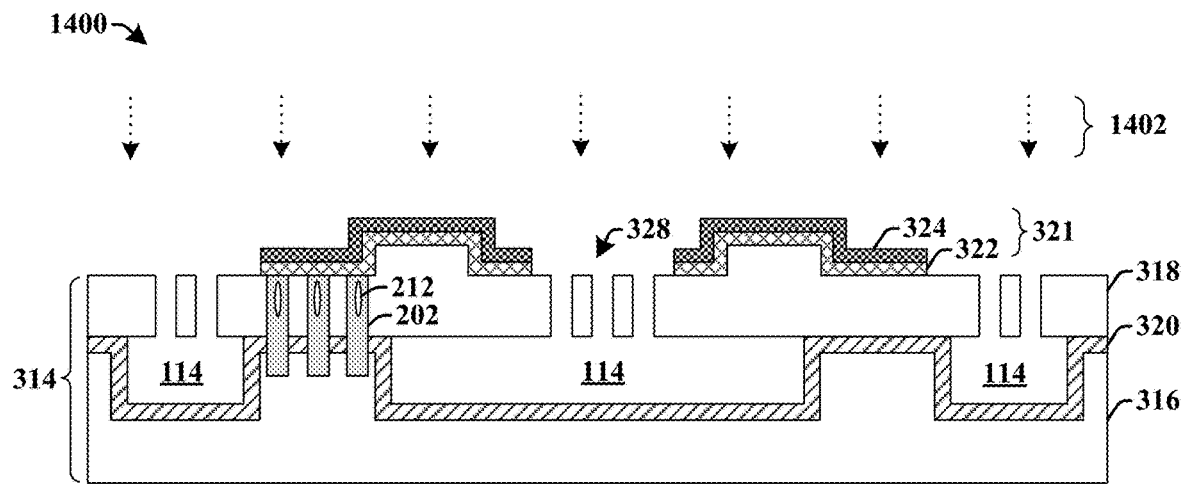

At 1618, the eutectic bonding layer and the conductive routing layer are patterned to form conductive bonding structures. The conductive bonding structures laterally extending from over the protrusions to over the polysilicon vias. FIG. 14 illustrates some embodiments of a cross-sectional view 1400 corresponding to act 1618.

At 1620, the MEMS structure is bonded to a CMOS substrate by way of the bonding structures. The CMOS substrate comprises a plurality of semiconductor devices arranged a semiconductor body. FIG. 15 illustrates some embodiments of a cross-sectional view 1500 corresponding to act 1620.

Therefore, the present disclosure relates to a micro-electromechanical system (MEMS) package that uses polysilicon inter-tier connections to provide for a low parasitic capacitance in MEM device signals, and a method of formation.

In some embodiments, the present disclosure relates to a micro-electromechanical system (MEMS) package. The MEMS package comprises a CMOS substrate having one or more semiconductor devices arranged within a semiconductor body, and a MEMS substrate having an ambulatory element. The MEMS substrate is connected to the CMOS substrate by a conductive bonding structure arranged on a front-side of the MEMS substrate at a location that is laterally offset from the ambulatory element. The MEMS package further comprises one or more conductive polysilicon vias extending through the MEMS substrate to the conductive bonding structure.

In other embodiments, the present disclosure relates to a MEMS package. The MEMS package comprises a CMOS substrate having one or more semiconductor devices arranged within a semiconductor body, and a MEMS substrate having an ambulatory element. The MEMS package further comprises a capping substrate having one or more depressions that form one or more cavities arranged between the capping substrate and the MEMS substrate, and an adhesive layer arranged between the MEMS substrate and the capping substrate. The MEMS package further comprises a plurality of polysilicon vias extending through the MEMS substrate from recesses within a surface of the capping substrate facing the MEMS substrate to a conductive bonding structure arranged between the CMOS substrate and the MEMS substrate.

In yet other embodiments, the present disclosure relates to a method forming a MEMS package. The method comprises forming one or more depressions within a capping substrate, and bonding a back-side of a MEMS substrate to the capping substrate to form one or more cavities between the capping substrate and the MEMS substrate. The method further comprises selectively etching a front-side of the MEMS substrate to form one or more trenches extending through the MEMS substrate. The method further comprises forming one or more polysilicon vias within the one or more trenches. The method further comprises forming a conductive bonding structure on the front-side of the MEMS substrate at a location contacting the one or more polysilicon vias, and bonding the MEMS substrate to a CMOS substrate having one or more semiconductor devices by way of the conductive bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method forming a micro-electromechanical system (MEMS) package, comprising:
   forming one or more depressions within a capping substrate;
   bonding a back-side of a MEMS substrate to the capping substrate after forming the one or more depressions, so that the one or more depressions define one or more cavities between the capping substrate and the MEMS substrate;
   selectively etching a front-side of the MEMS substrate to form one or more trenches extending through the MEMS substrate;
   forming one or more polysilicon vias within the one or more trenches;
   selectively etching the front-side of the MEMS substrate to form a protrusion extending outward from a recessed surface of the MEMS substrate after forming the one or more polysilicon vias within the one or more trenches, wherein an entirety of the protrusion is laterally offset to a single side of the one or more polysilicon vias;

forming a conductive routing layer over the protrusion and contacting the one or more polysilicon vias;

forming a bonding layer over the conductive routing layer;

patterning the conductive routing layer and the bonding layer to form a conductive bonding structure on the MEMS substrate at a location contacting the one or more polysilicon vias; and bonding the MEMS substrate to a substrate having one or more semiconductor devices by way of the conductive bonding structure.

2. The method of claim 1, further comprising:
forming a dielectric layer on the capping substrate prior to bonding the back-side of the MEMS substrate to the capping substrate, wherein the dielectric layer is disposed directly between the back-side of the MEMS substrate and the capping substrate after bonding the back-side of the MEMS substrate to the capping substrate.

3. The method of claim 2,
wherein sidewalls of the one or more polysilicon vias contact sidewalls of the dielectric layer; and
wherein the dielectric layer comprises a horizontally extending surface that protrudes outward from a sidewall of the dielectric layer and that is disposed within the one or more cavities.

4. The method of claim 2, wherein the conductive routing layer is formed to have a bottommost surface that is over a topmost surface of the one or more polysilicon vias and a sidewall extending along an outermost sidewall of the protrusion that faces away from the one or more polysilicon vias, the bottommost surface laterally extending past opposing outermost edges of the topmost surface.

5. The method of claim 1,
wherein the bonding layer comprises an eutectic bonding layer; and
wherein the one or more polysilicon vias respectively comprise one or more interior surfaces defining a void completely surrounded by a respective one of the one or more polysilicon vias.

6. The method of claim 5, wherein a top of the void is arranged along a first horizontal plane intersecting sidewalls of the MEMS substrate and a bottom of the void is arranged along a second horizontal plane intersecting the sidewalls of the MEMS substrate, the first horizontal plane and the second horizontal plane parallel to the front-side of the MEMS substrate.

7. The method of claim 5, wherein the void is located a distance that is in a range of between 1 micron and 5 microns below the front-side of the MEMS substrate.

8. The method of claim 1, wherein forming the one or more polysilicon vias comprises:
depositing polysilicon within the one or more trenches and over the front-side of the MEMS substrate; and
removing the polysilicon from the front-side of the MEMS substrate.

9. The method of claim 8, further comprising:
selectively etching the polysilicon and the front-side of the substrate to define the one or more polysilicon vias and to further form sidewalls of the MEMS substrate that define the protrusion.

10. The method of claim 1, wherein the MEMS substrate separates the conductive bonding structure from the capping substrate.

11. The method of claim 1, wherein the one or more depressions extend into the capping substrate to a greater depth than the one or more trenches.

12. The method of claim 1, wherein the one or more polysilicon vias respectively and continuously extend from a bottom surface contacting the conductive bonding structure to a top surface contacting the capping substrate.

13. The method of claim 1, wherein an outermost sidewall of the protrusion is laterally separated from the one or more polysilicon vias by a distance that is entirely laterally outside of the protrusion.

14. A method forming a micro-electromechanical system (MEMS) package, comprising:
forming one or more depressions within a capping substrate;
bonding a back-side of a MEMS substrate to the capping substrate after forming the one or more depressions, so that the one or more depressions define one or more cavities between the capping substrate and the MEMS substrate;
selectively etching a front-side of the MEMS substrate to form one or more trenches extending through the MEMS substrate;
forming one or more polysilicon vias within the one or more trenches;
forming a conductive bonding structure having a bottommost surface on the MEMS substrate and over a topmost surface of the one or more polysilicon vias that faces away from the MEMS substrate, wherein the MEMS substrate is between the conductive bonding structure and the capping substrate, and wherein the bottommost surface laterally extends past an outermost edge of the topmost surface;
bonding the MEMS substrate to a substrate having one or more semiconductor devices by way of the conductive bonding structure;
performing an etching process to remove a part of the one or more polysilicon vias and a part of the MEMS substrate, wherein the etching process defines a protrusion extending outward from a horizontally extending surface of the MEM substrate; and
forming the conductive bonding structure along sidewalls and an upper surface of the protrusion.

15. The method of claim 14, wherein the one or more polysilicon vias respectively comprise one or more interior surfaces defining a void completely surrounded by a respective one of the one or more polysilicon vias and located a distance that is in a range of between 1 micron and 5 microns below the front-side of the MEMS substrate.

16. The method of claim 14, further comprising:
performing a deposition process to deposit polysilicon within the one or more trenches and over an upper surface of the MEMs substrate; and
completely removing the polysilicon from over the upper surface of the MEMS substrate.

17. A method forming a micro-electromechanical system (MEMS) package, comprising:
forming one or more depressions within a capping substrate;
bonding a back-side of a MEMS substrate to the capping substrate after forming the one or more depressions, so that the one or more depressions define one or more cavities between the capping substrate and the MEMS substrate;
selectively etching a front-side of the MEMS substrate to form one or more trenches extending through the MEMS substrate and into the capping substrate;

forming polysilicon within the one or more trenches;

performing a planarization process to remove the polysilicon from over the MEMS substrate and to define one or more polysilicon vias within the one or more trenches;

depositing a conductive material on the MEMS substrate;

patterning the MEMs substrate after depositing the conductive material; and patterning the conductive material to form a conductive bonding structure on the MEMS substrate and on an upper surface of the one or more polysilicon vias defined by the planarization process.

18. The method of claim 17, wherein the conductive bonding structure comprises a first upper surface facing away from the MEMS substrate and a second upper surface facing away from the MEMS substrate, the first upper surface and the second upper surface directly coupled to opposing ends of a sidewall of the conductive bonding structure.

19. The method of claim 17, wherein the one or more depressions are arranged within a first side of the capping substrate, the first side of the capping substrate facing the MEMS substrate after bonding the back-side of the MEMS substrate to the capping substrate; and wherein the one or more polysilicon vias are separated from a second side of the capping substrate by a first distance that is larger than a second distance between the one or more depressions and the second side of the capping substrate, the second side of the capping substrate opposing the first side of the capping substrate.

20. The method of claim 17, wherein the conductive bonding structure has a bottom surface physically contacting the MEMS substrate and the upper surface of the one or more polysilicon vias defined by the planarization process.

* * * * *